(12) United States Patent
Okada

(10) Patent No.: US 6,242,337 B1
(45) Date of Patent: Jun. 5, 2001

(54) SEMICONDUCTOR DEVICE AND METHOD OF MANUFACTURING THE SAME

(75) Inventor: Norio Okada, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/167,987

(22) Filed: Oct. 8, 1998

(30) Foreign Application Priority Data

Oct. 8, 1997 (JP) .................................................. 9-275768

(51) Int. Cl.⁷ ........................ H01L 21/4763; H01L 23/02
(52) U.S. Cl. ........................ 438/622; 438/633; 438/703; 438/763
(58) Field of Search ........................ 438/396, 253, 438/126, 599, 611, 623, 294, 295, 479, 763, 703, 782, 783, 622, 633; 257/620, 643, 758, 703

(56) References Cited

U.S. PATENT DOCUMENTS

| 4,567,646 | * | 2/1986 | Ishikawa ..................... | 28/576 |
| 5,486,492 | * | 1/1996 | Yamamoto et al. .......... | 437/192 |
| 5,723,385 | * | 3/1998 | Shen ............................. | 438/763 |
| 5,801,079 | * | 9/1998 | Takaishi ....................... | 438/396 |
| 5,929,509 | * | 7/1999 | Shen ............................. | 257/620 |
| 5,960,305 | * | 9/1999 | Kumar .......................... | 438/598 |
| 5,965,939 | * | 10/1999 | Kim et al. .................... | 257/752 |
| 6,020,644 | * | 2/2000 | Tanigawa ..................... | 257/775 |
| 6,022,762 | * | 2/2000 | Perelli .......................... | 438/126 |

FOREIGN PATENT DOCUMENTS

| 61-125152 | 6/1986 | (JP) . |
| 1-185935 | 7/1989 | (JP) . |
| 5-335300 | 12/1993 | (JP) . |
| 8-31710 | 2/1996 | (JP) . |

* cited by examiner

Primary Examiner—Michael Trinh
Assistant Examiner—David Goodwin
(74) Attorney, Agent, or Firm—Foley & Lardner

(57) ABSTRACT

In a method of manufacturing a semiconductor device, a first interlevel insulating film is formed on a silicon wafer. A metal film is formed on the first interlevel insulating film. The metal film is formed to form a first electrode wiring layer having an end located inside an end of the first interlevel insulating film on a peripheral portion of the silicon wafer. An insulating film is formed on the silicon wafer including the first interlevel insulating film and the first electrode wiring layer. A second interlevel insulating film having an end located outside the end of the first electrode wiring layer on the peripheral portion of the silicon wafer is formed by processing the insulating film. A device manufactured by this manufacturing method is also disclosed.

4 Claims, 3 Drawing Sheets

SEMICONDUCTOR DEVICE AND METHOD OF MANUFACTURING THE SAME

BACKGROUND OF THE INVENTION

The present invention relates to a semiconductor device having a multilevel interconnection structure and a method of manufacturing the same.

The multilevel interconnection technique is used to integrate semiconductor integrated circuits at a higher density. In this multilevel interconnection technique, a wiring layer must be formed on a flatter insulating layer. As a scheme of obtaining such a flat insulating layer, chemical and mechanical polishing (CMP) is available.

For example, when a two-level interconnection structure is to be formed, an interlevel insulating film is formed after the first electrode wiring layer is formed, and the second electrode wiring layer is formed on the interlevel insulating film. The surface of the interlevel insulating film is not flat since a step is formed on it due to the presence of the first electrode wiring layer. Accordingly, the surface of the interlevel insulating film may be planarized by CMP described above, and the second electrode wiring layer may be formed on the planarized interlevel insulating film.

An electrode wiring layer is formed by photolithography, etching, and the like. In photolithography, a foreign matter produced by resist peeling on the peripheral portion of a wafer causes a decrease in yield of the manufacture of semiconductor devices and poses a problem accordingly.

Resist peeling will be briefly explained. In the manufacture of semiconductor integrated circuits, a pattern is formed by photolithography on a photoresist formed on the wafer by coating, and an underlying metal material is etched by using the formed pattern as a mask, thereby forming an electrode wiring layer.

During this etching, the wafer is held in an etching apparatus by clamping the peripheral portion of the wafer with a clamp. More specifically, when processing a wafer coated with a resist, the clamp and the resist film on the peripheral portion of the wafer come into contact with each other on the periphery of the wafer. When the clamp comes into contact with the resist film in this manner, the resist film on the peripheral portion of the wafer peels off to produce a foreign matter.

The wafer is conveyed or temporarily kept in stock as it is stored in a wafer carrier. In this case as well, the resist on the peripheral portion of the wafer peels off as it comes into contact with the wafer carrier, and produces a foreign matter.

In this manner, the presence of the resist film on the peripheral portion of the wafer produces a foreign matter to decrease the yield in the manufacture of semiconductor devices. Even if the resist film on the peripheral portion of the wafer does not peel off but remains until the separation step, it does not contribute at all to improvement in yield of the semiconductor devices.

As described above, the resist film on the peripheral portion of the wafer in photolithography merely causes a decrease in yield and is accordingly removed by the following method or the like prior to etching.

For example, in photolithography of a positive resist, the peripheral portion of the wafer is exposed before development and, during development, the resist on the peripheral portion of the wafer is removed by development. In this case, since the resist is removed from the peripheral portion of the wafer, a layer under the resist, e.g., a metal film under the resist, is also removed from the peripheral portion of the wafer in the following etching step.

In a normal semiconductor device manufacturing process, since photolithography and etching are repeated 10 times or more, removal of the resist from the peripheral portion of the wafer is performed each time photolithography and etching are performed. This removal of the resist film is performed for the purpose of forming a through hole not only in an electrode wiring layer but also in an interlevel insulating film. Therefore, the electrode wiring layer or the interlevel insulating film as the etching target is removed from the peripheral portion of the wafer.

Assume that the first to third layers are to be sequentially formed on a wafer. Also assume that the outermost peripheral end of the second layer is located inside the outermost peripheral end of the first layer on the peripheral portion of the first layer, i.e., a case wherein the outermost peripheral end surface of the first layer is exposed on the peripheral portion of the wafer.

If a resist film removal region of the third layer on the peripheral portion of the wafer is located outside the outermost peripheral end of the second layer, the outermost peripheral end of the third layer becomes outside the outermost peripheral end of the second layer accordingly. Hence, on the outermost peripheral end of the peripheral portion of the wafer, the first and third layers are undesirably in contact with each other.

In this state, if the adhesion properties between the first and third layers are poor, the end of the third layer peels off from the first layer on the peripheral portion of the wafer to produce a foreign matter. If the first and third layers form an electrode wiring layer, a leakage current flows between them.

FIG. 3 shows a conventional semiconductor device of Japanese Patent Laid-Open No. 8-31710 free from this problem. A first interlevel insulating film 2, an electrode wiring layer 3, and a second interlevel insulating film 4 are sequentially formed on a silicon substrate 1. Referring to FIG. 3, a resist film removal region in photolithography is designed such that the outermost peripheral end, on the peripheral portion of the wafer, of a layer which is formed later is located more inside.

In the conventional semiconductor device shown in FIG. 3, since the end of the electrode wiring layer 3 is exposed from the peripheral portion of the wafer, if the surface of the second interlevel insulating film 4 is polished by CMP, the second interlevel insulating film 4 is undesirably ground to produce chippings. These chippings may enter the polish surface to damage it.

Even when the electrode wiring layer 3 is not formed on the outermost peripheral end of the peripheral portion of the wafer but is covered with the second interlevel insulating film 4, the closer to the edge of the wafer, the smaller the thickness on the peripheral portion of the wafer. In particular, the lower among three or more layers, the smaller the thickness of its end.

For this reason, if the second interlevel insulating film 4 on the electrode wiring layer 3 is polished by CMP, the second interlevel insulating film 4 on the peripheral portion of the wafer, which has become thin, is further ground to disappear. Then, the end of the electrode wiring layer 3 is exposed. In this case, when CMP is continued, the exposed electrode wiring layer 3 is ground, and its chippings enter the polish surface of the interlevel insulating film to damage it.

SUMMARY OF THE INVENTION

It is an object of the present invention to provide a semiconductor device having a multilevel interconnection structure in which the surface of the interlevel insulating film is not damaged by chemical and mechanical polishing, and a method of manufacturing the same.

In order to achieve the above object, according to the present invention, there is provided a method of manufacturing a semiconductor device, comprising the steps of forming a first insulating layer on a semiconductor substrate, forming a conductive film on the first insulating layer, processing the conductive film to form an electrode wiring layer having an end located inside an end of the first insulating layer on a peripheral portion of the semiconductor substrate, forming an insulating film on the semiconductor substrate including the first insulating layer and the electrode wiring layer, and forming a second insulating layer having an end located outside the end of the electrode wiring layer on the peripheral portion of the semiconductor substrate by processing the insulating film.

DESCRIPTION OF THE PREFERRED EMBODIMENT

The present invention will be described in detail with reference to the accompanying drawings.

Figure 1:
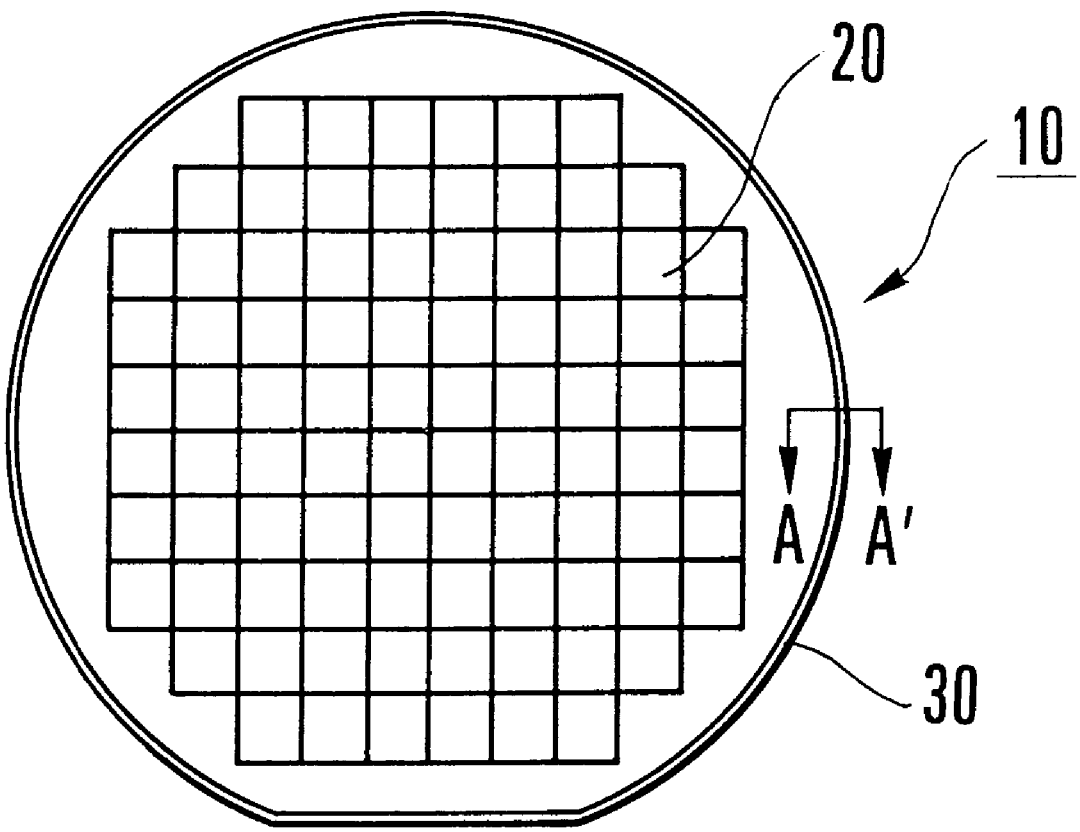
FIG. 1 is a plan view of a semiconductor wafer according to an embodiment of the present invention.

FIG. 1 shows a semiconductor wafer according to an embodiment of the present invention. Referring to FIG. 1, a plurality of semiconductor chips 20 formed with semiconductor integrated circuits are arranged on one semiconductor wafer 10 (multi-surface bonding). No chips 20 are formed on a peripheral portion 30 of the wafer since they might come into contact with a wafer holding means, e.g., a clamp, during conveyance. A resist is removed from the peripheral portion 30 of the wafer prior to etching, and an interlevel insulating film and an electrode wiring layer are removed from the peripheral portion 30 of the wafer.

A method of manufacturing a semiconductor device will be described with reference to the sectional views of the peripheral portion 30 of the wafer taken along the line A-A'.

Figure 2A:
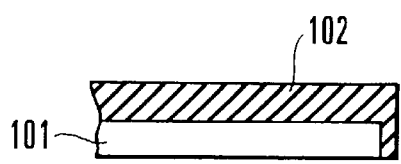
FIGS. 2A to 2L are sectional views of the peripheral portion of the wafer showing the steps in a method of manufacturing the semiconductor wafer shown in FIG. 1.

First, as shown in FIG. 2A, an insulating film 102 made of silicon oxide is formed on a silicon wafer 101 constituting the semiconductor wafer 10 of FIG. 1. In the chip formation region of the silicon wafer 101, semiconductor elements, e.g., MOS (Metal Oxide Semiconductor) transistors, are formed under the insulating film 102.

Figure 2B:
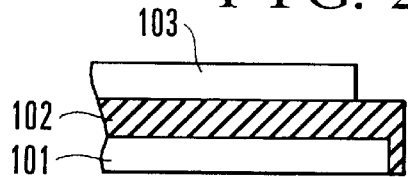

In order to form a contact hole (not shown) at a desired position of the insulating film 102, a resist pattern 103 is formed on the insulating film 102 as shown in FIG. 2B. The end of the resist pattern 103 on the peripheral portion 30 of the wafer is located inside the end of the silicon wafer 101. Thereafter, the insulating film 102 is selectively etched by using the resist pattern 103 as the mask, thereby forming a first interlevel insulating film 102a (FIG. 2C).

Figure 2C:
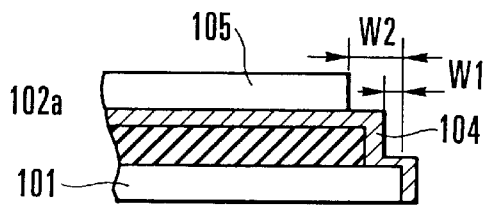

The resist pattern 103 is removed, and a metal film 104 is formed on the surface region of the wafer 101 including the first interlevel insulating film 102a, as shown in FIG. 2C. Subsequently, a resist pattern 105 for forming a wiring pattern is formed on the metal film 104. The end portion of the resist pattern 105 on the peripheral portion 30 of the wafer is located inside the end of the first interlevel insulating film 102a. In other words, W2≧W1 is set where W1 is the distance between the end of the wafer 101 and the end of the metal film 104 and W2 is the distance between the end of the wafer 101 and the resist pattern 105.

Figure 2D:
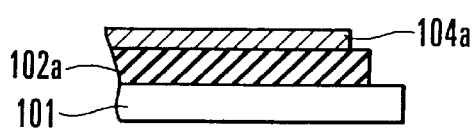

The metal film 104 is selectively etched by using the resist pattern 105 as the mask, thereby forming a first electrode wiring layer 104a on the first interlevel insulating film 102a, as shown in FIG. 2D. Hence, the end of the first electrode wiring layer 104a on the peripheral portion 30 of the wafer is located inside the end of the first interlevel insulating film 102a. After the first electrode wiring layer 104a is formed, the resist pattern 105 is removed.

Figure 2E:
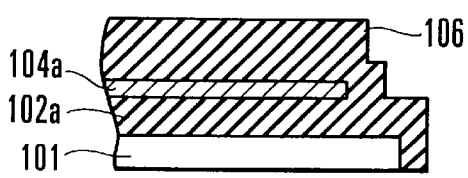

As shown in FIG. 2E, an insulating film 106 is formed on the surface region of the wafer 101 including the first electrode wiring layer 104a and first interlevel insulating film 102a. Since only two layers are formed on the peripheral portion 30 of the wafer, the insulating film 106 on the end of the first electrode wiring layer 104a does not become very thin.

Figure 2F:
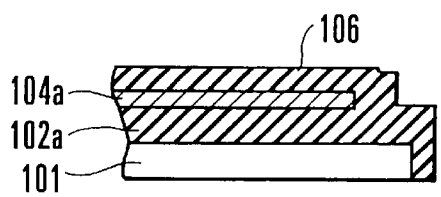

As shown in FIG. 2F, the surface of the insulating film 106 is planarized by CMP. Since the insulating film 106 on the peripheral portion 30 of the wafer is not very thin, as described above, the end of the first electrode wiring layer 104a is not exposed by performing planarization by CMP.

Figure 2G:
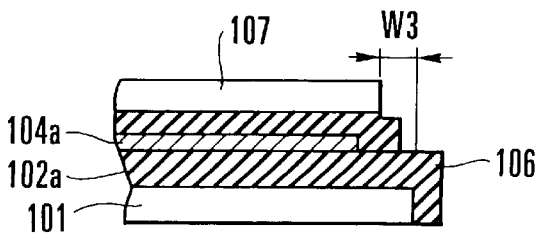

In order to form a contact hole to be connected to the first electrode wiring layer 104a or the element, a resist pattern 107 is formed on the planarized insulating film 106, as shown in FIG. 2G. The end of the resist pattern 107 on the peripheral portion 30 of the wafer is located at the same position as or outside the end of the first interlevel insulating film 102a. In other words, W2≧W3 is set where W3 is the distance between the end of the wafer 101 and the end of the resist pattern 107.

Figure 2H:
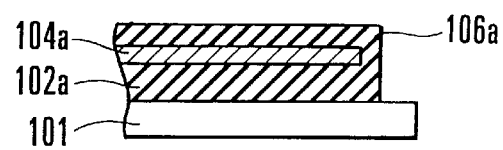

The insulating film 106 is selectively etched by using the resist pattern 107 as the mask, thereby forming a second interlevel insulating film 106a as shown in FIG. 2H. After the second interlevel insulating film 106a is formed, the resist pattern 107 is removed.

Figure 2I:
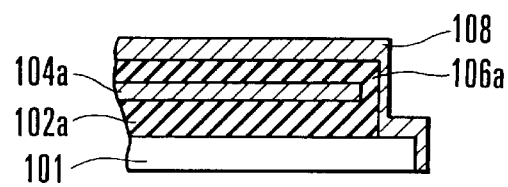
Figure 2J:
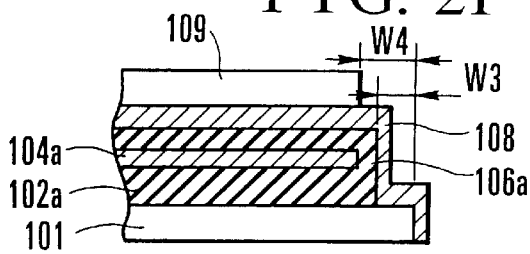

As shown in FIG. 2I, a metal film 108 is formed on the surface region of the wafer 101 including the second interlevel insulating film 106a. As shown in FIG. 2J, a resist pattern 109 for forming a wiring pattern is formed on the metal film 108. The end of the resist pattern 109 on the peripheral portion 30 of the wafer is located inside the end of the second interlevel insulating film 106a. In other words, W4≧W3 is set where W4 is the distance between the end of the wafer 101 and the end of the resist pattern 109.

Figure 2K:
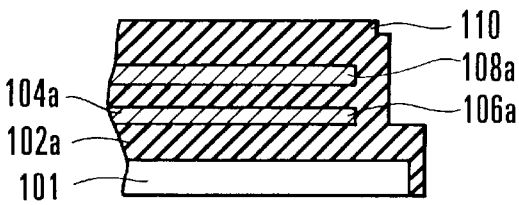

The metal film 108 is selectively etched by using the resist pattern 109 as the mask, thereby forming a second electrode wiring layer 108a, as shown in FIG. 2K. After the second electrode wiring layer 108a is formed, the resist pattern 109 is removed. An insulating film 110 is formed on the surface region of the wafer 101 including the second electrode wiring layer 108a and the second interlevel insulating film 106a.

As described above, the ends of the first and second electrode wiring layers 104a and 108a on the peripheral portion 30 of the wafer are formed at almost the same position. That is, on the peripheral portion 30 of the wafer, the end of the second electrode wiring layer 108a is not located inside the end of the first electrode wiring layer 104a.

Figure 2L:
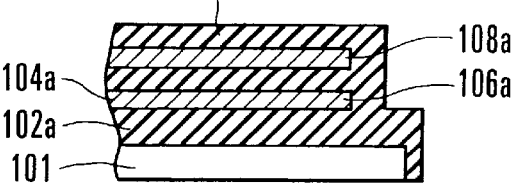
Figure 3:
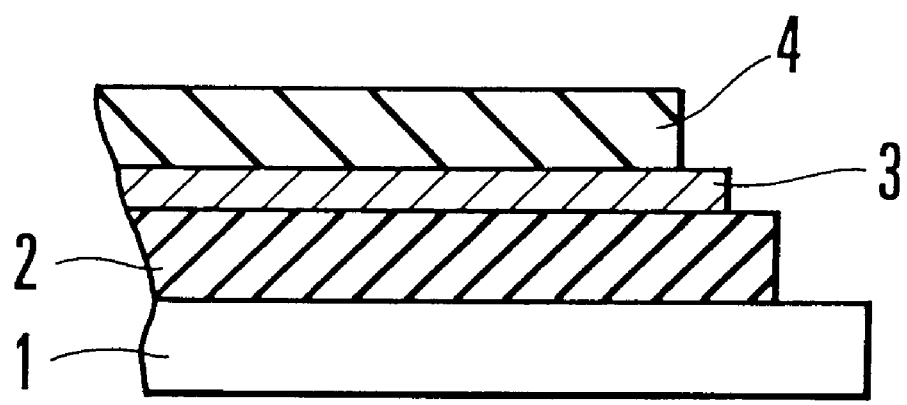
FIG. 3 is a sectional view of the peripheral portion of a conventional semiconductor wafer.

Hence, on the peripheral portion 30 of the wafer, the thickness of the insulating film 110 on the end of the first electrode wiring layer 104a does not become thinner than at other regions. Even when the insulating film 110 is planarized in this state by CMP, as shown in FIG. 2L, on the peripheral portion 30 of the wafer, the end of the first electrode wiring layer 104a is covered with the second interlevel insulating film 106a and insulating film 110 and is not exposed accordingly. Similarly, the end of the second electrode wiring layer 108a is covered with the insulating film 110 and is not exposed.

In the same manner, on the peripheral portion of the wafer, an upper electrode wiring layer is formed such that its end is not located inside the end of a lower electrode wiring layer, and an interlevel insulating film is formed to extend outside the lower electrode wiring layer. As a result, in the same manner as described above, the end of the electrode wiring layer on the peripheral portion of the wafer can be prevented from being exposed when the surface of an insulating film above it is planarized by CMP.

As has been described above, according to the present invention, when the interlevel insulating layer of a multilevel interconnection structure is planarized by CMP, the end of a lower electrode wiring layer which has already been formed is not exposed on the peripheral portion of the wafer. As a result, chippings of the electrode wiring layer are not produced, and the polished surface can be prevented from being damaged.

What is claimed is:

1. A method of processing a semiconductor wafer, comprising:

forming a first insulating layer on the semiconductor wafer;

forming a conductive film on said first insulating layer;

processing said conductive film to form an electrode wiring layer having an end located inside an end of said first insulating layer at a periphery of said semiconductor wafer;

forming an insulating film on said semiconductor wafer including said first insulating layer and said electrode wiring layer; and processing the insulating film to form a second insulating layer having an end located outside said end of said electrode wiring layer at said periphery of said semiconductor wafer, wherein said method further comprises planarizing a surface of said insulating film by chemical and mechanical polishing, and wherein processing the insulating film comprises processing said planarized insulating film.

2. A method according to claim 1, wherein on said peripheral portion of said semiconductor wafer, said end of said second insulating layer is located at the same position as that of or outside said end of said first insulating layer.

3. A method according to claim 1, wherein said electrode wiring layer has a surface, including a peripheral end face thereof, which is covered with said second insulating layer.

4. The method recited in claim 1, further comprising:

forming a second conductive film on said second insulating layer;

processing said second conductive film to form a second electrode wiring layer having an end located inside an end of said second insulating layer at a periphery of said semiconductor wafer;

forming a second insulating film on said semiconductor wafer including said second insulating layer and said second electrode wiring layer; and processing the second insulating film to form a third insulating layer having an end located outside said end of said second electrode wiring layer at said periphery of said semiconductor wafer.

* * * * *